US012588437B2

(12) United States Patent
      Bajaj et al.

(10) Patent No.: US 12,588,437 B2
(45) Date of Patent: Mar. 24, 2026

(54) INTEGRATED DIPOLE REGION FOR TRANSISTOR

(71) Applicant: Applied Materials, Inc., Santa Clara, CA (US)

(72) Inventors: Geetika Bajaj, Cupertino, CA (US); Tianyi Huang, Santa Clara, CA (US); Hsin-Jung Yu, Santa Clara, CA (US); Yixiong Yang, Fremont, CA (US); Srinivas Gandikota, Santa Clara, CA (US); Chi-Chou Lin, San Jose, CA (US); Pei Hsuan Lin, Millbrae, CA (US)

(73) Assignee: Applied Materials, Inc., Santa Clara, CA (US)

( * ) Notice: Subject to any disclaimer, the term of this patent is extended or adjusted under 35 U.S.C. 154(b) by 452 days.

(21) Appl. No.: 18/126,583

(22) Filed: Mar. 27, 2023

(65) Prior Publication Data

US 2024/0332008 A1    Oct. 3, 2024

(51) Int. Cl.
H01L 21/02 (2006.01)
H01L 21/28 (2025.01)

(52) U.S. Cl.
CPC .. H01L 21/02321 (2013.01); H01L 21/02178 (2013.01); H01L 21/02181 (2013.01); (Continued)

(58) Field of Classification Search
None
See application file for complete search history.

(56) References Cited

U.S. PATENT DOCUMENTS

| | | | |
|---|---|---|---|
| 8,420,474 B1 | 4/2013 | Frank et al. | |
| 8,901,630 B2 | 12/2014 | Huh et al. | |

(Continued)

FOREIGN PATENT DOCUMENTS

| | | |
|---|---|---|
| CN | 103413832 A | 11/2013 |
| KR | 20140086609 A | 7/2014 |
| WO | 9945594 A1 | 9/1999 |

OTHER PUBLICATIONS

PCT International Search Report and Written Opinion in PCT/US2020/033623 dated Oct. 20, 2020, 12 pages.

(Continued)

*Primary Examiner* — Erik Kielin
(74) *Attorney, Agent, or Firm* — Servilla Whitney LLC

(57) ABSTRACT

Methods of manufacturing and processing semiconductor devices (i.e., electronic devices) are described. Embodiments of the disclosure advantageously provide electronic devices which meet reduced thickness, lower thermal budget, and Vt requirements, and have improved device performance and reliability. The electronic devices described herein comprise a source region, a drain region, and a channel separating the source region and the drain region, an interfacial layer on a top surface of the channel, a high-κ dielectric layer on the interfacial layer, a dipole layer on the high-κ dielectric layer, and a capping layer on the dipole layer. In some embodiments, the dipole layer comprises a metal oxynitride (MON), such as aluminum oxynitride (AlON). In some embodiments, the methods comprise annealing the substrate to drive atoms from the dipole layer into one or more of the interfacial layer or the high-k dielectric layer.

14 Claims, 4 Drawing Sheets

100

(52) U.S. Cl.
CPC .. *H01L 21/02189* (2013.01); *H01L 21/02194* (2013.01); *H01L 21/28229* (2013.01)

(56) References Cited

U.S. PATENT DOCUMENTS

| | | | |
|---|---|---|---|
| 11,289,579 | B2 | 3/2022 | Lin et al. |
| 2003/0072975 | A1* | 4/2003 | Shero ................... H10D 64/691 |
| | | | 257/E21.268 |
| 2007/0158702 | A1 | 7/2007 | Doczy et al. |
| 2009/0283835 | A1* | 11/2009 | Yu .......................... H10D 64/66 |
| | | | 257/E21.616 |
| 2011/0147798 | A1 | 6/2011 | Radosavljevic et al. |
| 2012/0184093 | A1 | 7/2012 | Chudzik et al. |
| 2015/0262887 | A1 | 9/2015 | Xu et al. |
| 2017/0179261 | A1 | 6/2017 | Xu et al. |
| 2019/0148237 | A1 | 5/2019 | Wang |
| 2019/0279913 | A1 | 9/2019 | Gluschenkov et al. |
| 2020/0373404 | A1* | 11/2020 | Lin ...................... H10D 64/685 |
| 2021/0098581 | A1 | 4/2021 | Lin et al. |
| 2021/0366783 | A1 | 11/2021 | Chu et al. |
| 2022/0115516 | A1 | 4/2022 | Lin et al. |
| 2022/0254900 | A1* | 8/2022 | Yang ................. H01L 21/28185 |
| 2022/0352389 | A1 | 11/2022 | Kim et al. |

OTHER PUBLICATIONS

PCT International Search Report and Written Opinion in PCT/US2020/053182 dated Jan. 15, 2021, 12 pages.

Jeon, Nari , et al., "Plasma-Enhanced Atomic Layer Deposition of TiAlN: Compositional and Optoelectronic Tunability", ACS Appl. Mater, Interfaces 2019, 11, 11602-11611.

Lin, Yu-Hsien , et al., "Work Function Adjustment by Using Dipole Engineering for TaN—Al2O3—Si3N4—HfSiOx-Silicon Nonvolatile Memory", Materials 2015, 8, 5112-5120; doi:10.3390/ma8085112.

"PCT International Search Report and Written Opinion in PCT/US2024/021074 dated Jul. 17, 2024, 11 pages".

* cited by examiner

100

DEPOSIT AN INTERFACIAL LAYER ON A TOP SURFACE OF A CHANNEL ON A SEMICONDUCTOR SUBSTRATE — 102

DEPOSIT A HIGH-κ DIELECTRIC LAYER ON THE INTERFACIAL LAYER — 104

DEPOSIT A DIPOLE LAYER ON THE HIGH-κ DIELECTRIC LAYER — 106

DEPOSIT A CAPPING LAYER ON THE DIPOLE LAYER — 108

ANNEAL THE SEMICONDUCTOR SUBSTRATE — 110

PERFORM AN ETCH PROCESS TO REMOVE THE CAPPING LAYER AND/OR THE DIPOLE LAYER — 112

INTEGRATED DIPOLE REGION FOR TRANSISTOR

TECHNICAL FIELD

Embodiments of the present disclosure pertain to the field of electronic device manufacturing, and in particular, to transistors. More particularly, embodiments of the disclosure are directed to FinFET devices and methods of manufacturing FinFET devices.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

Transistors are circuit components or elements that are often formed on semiconductor devices. Many transistors may be formed on a semiconductor device in addition to capacitors, inductors, resistors, diodes, conductive lines, or other elements, depending on the circuit design. Integrated circuits incorporate planar field-effect transistors (FETs) in which current flows through a semiconducting channel between a source and a drain, in response to a voltage applied to a control gate.

As device dimensions have shrunk, device geometries and materials have experienced difficulty maintaining switching speeds without incurring failures. Several new technologies emerged that allowed chip designers to continue shrinking gate lengths. Control of the dimensions of device structure remains a challenge for present and future technology generations.

Shrinking of the materials currently used as negative metal-oxide-semiconductor (nMOS) transistors and positive metal-oxide-semiconductor (pMOS) transistors have become a challenge due to change in basic properties, such as threshold voltage ($V_t$). Additionally, the migration of transistor technology from planar FET to FinFET to gate all-around (GAA) devices requires conformal work function layers for multiple threshold voltages (multi-Vt). The $V_t$ tuning range will be limited by the film thickness variation with further scaling down of device sizes.

There are also challenges associated with conventional dipole engineering techniques. To achieve the desired dipole effect, the desired element is driven from a deposited film with spike anneal and removed after drive in. The spike anneal can potentially cause an equivalent oxide thickness (EOT) penalty and high thermal budget because free oxygen atoms in the gate dielectric layers and the overlaying dipole stack diffuse downward to oxidize the underlying silicon layer.

Additionally, precise control of the amount of dipole species in metal gate stacks, such as high-κ metal gate stacks, is crucial to achieve desired $V_t$ (or multi-$V_t$) for transistors. Conventional atomic layer deposition (ALD) processes can grow films as thin as 3 Å, which may still be too thick and cause undesired excess $V_t$ tuning, an EOT penalty and/or device leakage. Below this thickness usually causes discontinuous film growth (such as island growth), thus is not considered to be achievable by ALD processes. With the further scaling of GAA structures, the distance between nanosheets will be less than 4 nm, and therefore, further scaling down film thickness may no longer be viable for achieving multi-$V_t$ in advanced GAA nodes.

Accordingly, there is a need for methods of manufacturing electronic devices that meet reduced thickness, lower thermal budget, and $V_t$ requirements (including multi-Vt), and have minimal, if any, EOT penalty.

SUMMARY

One or more embodiments are directed to a method of manufacturing an electronic device. In some embodiments, the method includes depositing an interfacial layer on a top surface of a channel located between a source and a drain on a semiconductor substrate; depositing a high-κ dielectric layer on the interfacial layer; and depositing a dipole layer on the high-κ dielectric layer. In some embodiments, the dipole layer comprises a metal oxynitride (MON). The method further comprises depositing a capping layer on the dipole layer.

Additional embodiments are directed to a method of manufacturing an electronic device. In some embodiments, the method includes depositing an interfacial layer on a top surface of a channel located between a source and a drain on a semiconductor substrate. The interfacial layer comprises a dielectric material selected from one or more of silicon (Si), silicon oxide (SiOx), doped silicon, doped silicon oxide, or spin-on dielectrics. The method further comprises depositing a high-κ dielectric layer on the interfacial layer. The high-κ dielectric layer comprises one or more of hafnium oxide (HfOx), zirconium oxide (ZrOx), or hafnium zirconium oxide (HfZrOx). The method further comprises depositing a dipole layer (e.g., aluminum oxynitride (AlON)) on the high-κ dielectric layer, and depositing a capping layer on the dipole layer. The capping layer comprises one or more of amorphous silicon, a metal, a metal carbide, a metal nitride, or a metal oxide.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
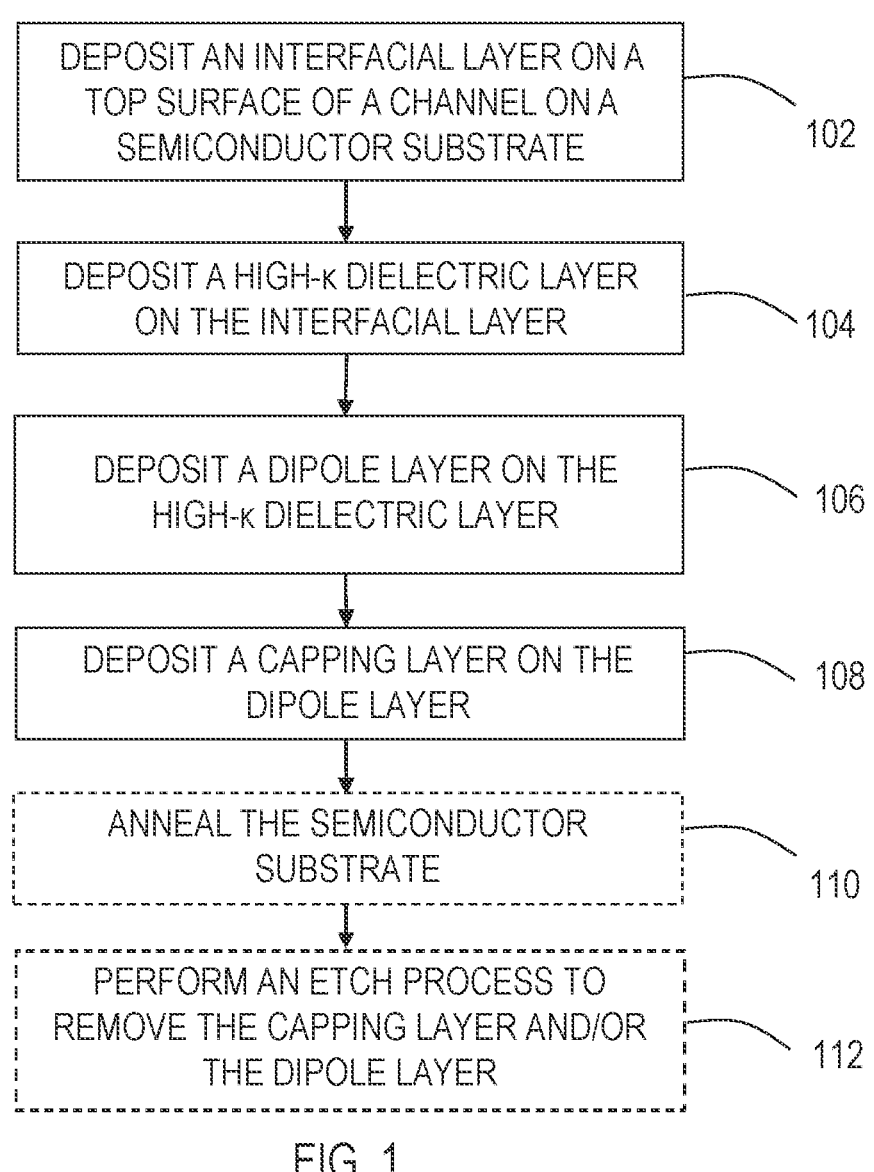
FIG. 1 illustrates a process flow diagram of a method according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

As used in this specification and the appended claims, the term "substrate" or "wafer" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

The term "on" indicates that there is direct contact between elements. The term "directly on" indicates that there is direct contact between elements with no intervening elements.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate, such as a semiconductor substrate, and exhibit a doping profile suitable for a particular application. The gate is positioned over the channel region and includes a gate dielectric interposed between a gate electrode and the channel region in the semiconductor substrate.

As used herein, the term "field effect transistor" or "FET" refers to a transistor that uses an electric field to control the electrical behavior of the device. Field effect transistors are voltage controlled devices where their current carrying ability is changed by applying an electric field. Field effect transistors generally display very high input impedance at low temperatures. The conductivity between the drain and source terminals is controlled by an electric field in the device, which is generated by a voltage difference between the body and the gate of the device. The FET's three terminals are source(S), through which the carriers enter the channel; drain (D), through which the carriers leave the channel; and gate (G), the terminal that modulates the channel conductivity. Conventionally, current entering the channel at the source(S) is designated Is and current entering the channel at the drain (D) is designated ID. Drain-to-source voltage is designated VDs. By applying voltage to gate (G), the current entering the channel at the drain (i.e. Ip) can be controlled.

The metal-oxide-semiconductor field-effect transistor (MOSFET) is a type of field-effect transistor (FET) and is used in integrated circuits and high speed switching applications. MOSFET has an insulated gate, whose voltage determines the conductivity of the device. This ability to change conductivity with the amount of applied voltage is used for amplifying or switching electronic signals. A MOS-FET is based on the modulation of charge concentration by a metal-oxide semiconductor (MOS) capacitance between a body electrode and a gate electrode located above the body and insulated from all other device regions by a gate dielectric layer. Compared to the MOS capacitor, the MOS-FET includes two additional terminals (source and drain), each connected to individual highly doped regions that are separated by the body region. These regions can be either p or n type, but they are both of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p-type substrate region. If the MOSFET is a p-channel or pMOS FET, then the source and drain are p+ regions and the body is a n-type substrate region. The source is so named because it is the source of the charge carriers (electrons for n-channel, holes for p-channel) that flow through the channel; similarly, the drain is where the charge carriers leave the channel.

A nMOS FET is made up of a n-type source and drain and a p-type substrate. When a voltage is applied to the gate, holes in the body (p-type substrate) are driven away from the gate. This allows forming an n-type channel between the source and the drain and a current is carried by electrons from source to the drain through an induced n-type channel. Logic gates and other digital devices implemented using nMOSs are said to have nMOS logic. There are three modes of operation in a nMOS called the cut-off, triode and saturation. Circuits with nMOS logic gates dissipate static power when the circuit is idling, since DC current flows through the logic gate when the output is low.

A pMOS FET is made up of p-type source and drain and a n-type substrate. When a positive voltage is applied between the source and the gate (negative voltage between gate and source), a p-type channel is formed between the source and the drain with opposite polarities. A current is carried by holes from source to the drain through an induced p-type channel. A high voltage on the gate will cause a pMOS not to conduct, while a low voltage on the gate will cause it to conduct. Logic gates and other digital devices implemented using pMOS are said have pMOS logic. pMOS technology is low cost and has a good noise immunity.

In a nMOS, carriers are electrons, while in a pMOS, carriers are holes. When a high voltage is applied to the gate, nMOS will conduct, while pMOS will not. Furthermore, when a low voltage is applied in the gate, nMOS will not conduct and pMOS will conduct. nMOS are considered to be faster than pMOS, since the carriers in nMOS, which are electrons, travel twice as fast as holes, which are the carriers in pMOS. But pMOS devices are more immune to noise than nMOS devices. Furthermore, nMOS ICs would be smaller than pMOS ICs (that give the same functionality), since the nMOS can provide one-half of the impedance provided by a pMOS (which has the same geometry and operating conditions).

As used herein, the term "fin field-effect transistor (Fin-FET)" refers to a MOSFET transistor built on a substrate where the gate is placed on two, three, or four sides of the channel or wrapped around the channel, forming a double gate structure. FinFET devices have been given the generic name FinFETs because the source/drain region forms "fins" on the substrate. FinFET devices have fast switching times and high current density.

As used herein, the term "gate all-around (GAA)," is used to refer to an electronic device, e.g., a transistor, in which the gate material surrounds the channel region on all sides. The channel region of a GAA transistor may include nano-wires or nano-slabs or nano-sheets, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

As used herein, the term "nanowire" refers to a nano-structure, with a diameter on the order of a nanometer (10-9 meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g., DRAM) and non-volatile (e.g., NAND) devices. As used herein, the term "nanosheet" refers to a two-dimensional nanostructure with a thickness in a scale ranging from about 0.1 nm to about 1000 nm, or from 0.5 nm to 500 nm, or from 0.5 nm to 100 nm, or from 1 nm to 500 nm, or from 1 nm to 100 nm, or from 1 nm to 50 nm.

Embodiments of the present disclosure advantageously provide methods of manufacturing electronic devices which meet reduced thickness, lower thermal budget, and $V_t$ requirements, and have improved device performance and reliability. One or more embodiments are advantageously directed to materials that can be used as effective dipole for p-FET which improves $V_t$ and does not impact equivalent oxide thickness (EOT). Embodiments of the new class of material can advantageously be used for p-dipole without EOT increase. Embodiments of the disclosure improve $V_t$ significantly without EOT penalty due to a new integration scheme. Embodiments of the disclosure include dipole materials that provide at least 50 mV $V_t$ shift with minimum EOT increase.

Embodiments of the disclosure advantageously provide methods for improving $V_t$ without EOT increase relative to metal oxide and metal nitride films.

For example, many metal oxide films such as AlOx are formed with EOT penalty, as bond dissociation energy of Al—O is higher and it is more difficult to drive in aluminum atoms into the high-κ dielectric layer during the spike anneal process.

Many metal nitride films, such as AlN, have lower bond dissociation energy, so it is possible to drive in aluminum atoms into the high-κ dielectric layer during the spike anneal process with minimal, or no EOT penalty. As a result of the spike anneal, however, nitrogen atoms will also be driven into the high-κ dielectric layer, which will lead to formation of a midgap material, thereby losing the benefit of forming an effective dipole. Additionally, excess nitrogen reduces the V flat band benefit and can cause leakage.

Embodiments of the disclosure advantageously provide deposition methods for tuning the amount of oxygen and/or nitrogen in the deposited dipole layer.

The embodiments of the disclosure are described by way of the Figures, which illustrate devices (e.g., transistors) and processes for forming transistors in accordance with one or more embodiments of the disclosure. The processes shown are merely illustrative possible uses for the disclosed processes, and the skilled artisan will recognize that the disclosed processes are not limited to the illustrated applications.

FIG. 1 depicts a flow diagram of method 100 of manufacturing an electronic device in accordance with one or more embodiments of the present disclosure. Method 100 begins at operation 102 by depositing an interfacial layer on a top surface of a channel located between a source and a drain on a semiconductor substrate. At operation 104, a high-κ dielectric layer is deposited on the interfacial layer. At operation 106, a dipole layer is deposited on the high-κ dielectric layer. At operation 108, a capping layer is deposited on the dipole layer. At operation 110, method 100 optionally includes annealing the semiconductor substrate. At operation 112, method 100 optionally includes performing an etch process to remove one or more of the capping layer or the dipole layer.

In some embodiments, at operation 102, the interfacial layer is deposited using a deposition technique, such as, but not limited to, ALD, CVD, PVD, MBE, MOCVD, spin-on, or other insulating layer deposition techniques known to the skilled artisan. In one or more embodiments, the interfacial layer may be formed by etching and an oxide forming on the surface.

In some embodiments, at operation 102, a wet chemistry technique is performed to form the interfacial layer. The wet chemistry technique may be any suitable technique known to the skilled artisan. In some embodiments, the wet chemistry technique includes a pre-clean process. In some embodiments, the pre-clean process includes using a SC-1 solution comprising one or more of ozone, ammonium hydroxide or hydrogen peroxide. In some embodiments, the pre-clean process includes using a SC-1 solution without ozone, ammonium hydroxide or hydrogen peroxide. In some embodiments, after using the SC-1 solution, the pre-clean process includes using dilute hydrofluoric acid (dilute HF), including greater than 100:1, such as 130:1 dilute HF, to etch away native oxide on the substrate to form a hydrophobic surface (i.e., the interfacial layer).

In some embodiments, at operation 104, the high-κ dielectric layer is deposited using a deposition technique, such as, but not limited to, ALD, CVD, PVD, MBE, MOCVD, spin-on, or other insulating layer deposition techniques known to the skilled artisan. In some embodiments, at operation 104, the high-κ dielectric layer is conformally deposited by ALD.

In some embodiments, at operation 106, the dipole layer is deposited on the high-κ dielectric layer using a deposition technique, such as, but not limited to, ALD, CVD, PVD, MBE, MOCVD, spin-on, or other insulating layer deposition techniques known to the skilled artisan.

Embodiments of the disclosure advantageously provide deposition methods for tuning the amount of oxygen and/or nitrogen in the deposited dipole layer. The deposited dipole layer advantageously has a nitrogen content of less than or equal to 5%, less than or equal to 2%, or less than or equal to 1% on an atomic basis.

The dipole layer may be deposited as a single layer or as a multilayer film. The dipole layer may be deposited to a predetermined thickness.

In some embodiments, depositing the dipole layer comprises exposing the semiconductor substrate to a cycle comprising a pulse of a metal-containing precursor, a pulse of a nitrogen-containing reactant, and a pulse of an oxygen-containing reactant. In some embodiments, the semiconductor substrate is purged after each pulse. In specific embodiments, the nitrogen content in the deposited dipole layer can be tuned to a desired content. In specific embodiments, the metal content and oxygen content increases, and the nitrogen content decreases after each cycle. The cycle may be repeated until the dipole layer is deposited to a predetermined thickness.

In some embodiments, depositing the dipole layer comprises exposing the semiconductor substrate to a cycle comprising a pulse of a metal-containing precursor, a pulse of an oxygen-containing reactant, and a pulse of a nitrogen-containing reactant. In some embodiments, the semiconductor substrate is purged after each pulse. In specific embodiments, the oxygen content in the deposited dipole layer can be tuned to a desired content. In specific embodiments, the metal content and oxygen content increases, and the nitrogen content decreases after each cycle. The cycle may be repeated until the dipole layer is deposited to a predetermined thickness.

In some embodiments, depositing the dipole layer comprises exposing the semiconductor substrate to a co-flow of a metal-containing precursor and a nitrogen-containing reactant, a pulse of the metal-containing precursor, and a pulse an oxygen-containing reactant. In some embodiments, the semiconductor substrate is purged after each pulse. In specific embodiments, the nitrogen content in the deposited dipole layer can be tuned to a desired content. In specific embodiments, the metal content and oxygen content increases, and the nitrogen content decreases after each deposition cycle. The cycle may be repeated until the dipole layer is deposited to a predetermined thickness.

In some embodiments, the metal-containing precursor comprises one or more of titanium (Ti), tantalum (Ta), aluminum (Al), niobium (Nb), antimony (Sb), tellurium (Te), lanthanum (La), yttrium (Y), strontium (Sr), scandium (Sc). In some embodiments, the metal-containing precursor is an aluminum-containing precursor. The aluminum-containing precursor may be any suitable aluminum precursor. In some embodiments, the aluminum-containing precursor comprises trimethylaluminum (TMA) or aluminum chloride ($AlCl_3$).

In some embodiments, the oxygen-containing reactant comprises one or more of oxygen ($O_2$), ozone ($O_3$), or water ($H_2O$). In some embodiments, the oxygen-containing reactant comprises water ($H_2O$).

In some embodiments, the nitrogen-containing reactant comprises one or more of nitrogen ($N_2$), ammonia ($NH_3$), hydrazine ($N_2H_4$), or a co-flow of nitrogen radicals ($N_2^*$) and hydrogen radicals ($H^*$). In some embodiments the nitrogen-containing reactant comprises a substituted or unsubstituted alkyl hydrazine. In some embodiments, the alkyl hydrazine comprises in a range of from 1 carbon to 6 carbons. In one or more embodiments, the alkyl hydrazine is t-butyl hydrazine. In some embodiments, the nitrogen-containing reactant comprises a plasma. In some embodiments, the nitrogen-containing reactant comprises ammonia ($NH_3$).

In some embodiments, the deposited dipole layer comprises one or more of titanium oxynitride (TiON), tantalum oxynitride (TaON), aluminum oxynitride (AlON), niobium oxynitride (NbON), antimony oxynitride (SbON), tellurium oxynitride (TeON), lanthanum oxynitride (LaON), yttrium oxynitride (YON), strontium oxynitride (SrON), scandium oxynitride (ScON). In some embodiments, the dipole layer comprises aluminum oxynitride (AlON).

In some embodiments, the metal-containing precursor comprises trimethylaluminum (TMA), the oxygen-containing reactant comprises water ($H_2O$), and the nitrogen-containing reactant comprises ammonia ($NH_3$).

In some embodiments, the metal-containing precursor comprises aluminum chloride ($AlCl_3$), the oxygen-containing reactant comprises water ($H_2O$), and the nitrogen-containing reactant comprises ammonia ($NH_3$). In embodiments where the metal-containing precursor comprises aluminum chloride ($AlCl_3$), the deposited dipole layer has a chlorine (CI) content of less than or equal to 2%, or less than or equal to 1%, on an atomic basis.

In some embodiments, exposing the semiconductor substrate to a pulse of a metal-containing precursor (e.g., trimethylaluminum (TMA)), a pulse of an oxygen-containing reactant (e.g., water ($H_2O$)), and a pulse of a nitrogen-containing reactant (e.g., ammonia ($NH_3$)) forms a dipole layer having a nitrogen content of less than or equal to 1%, on an atomic basis. In one or more embodiments, the dipole layer has an aluminum (Al) content of about 31.65%, an oxygen ($O_2$) content of about 64.19%, and a nitrogen (N) content of about 0.16%, on an atomic basis.

In some embodiments, exposing the semiconductor substrate to a pulse of a metal-containing precursor (e.g., trimethylaluminum (TMA)), a pulse of an oxygen-containing reactant (e.g., water ($H_2O$)), and a pulse of a nitrogen-containing reactant (e.g., ammonia ($NH_3$)) forms a dipole layer having a nitrogen content (ammonia ($NH_3$)) of less than or equal to 1%, on an atomic basis. In one or more embodiments, the dipole layer has an aluminum (Al) content of about 27.45%, an oxygen ($O_2$) content of about 65.80%, and a nitrogen (N) content of about 0.42%, on an atomic basis.

In some embodiments, exposing the semiconductor substrate to a co-flow of a metal-containing precursor (e.g., trimethylaluminum (TMA)) and a nitrogen-containing reactant (e.g., ammonia ($NH_3$)), a pulse of the metal-containing precursor (e.g., trimethylaluminum (TMA)), and a pulse an oxygen-containing reactant (e.g., water ($H_2O$)) forms a dipole layer having a nitrogen content of less than or equal to 1%. In one or more embodiments, the dipole layer has an aluminum (Al) content of about 27.15%, an oxygen ($O_2$) content of about 66.7%, and a nitrogen (N) content of about 0.20%, on an atomic basis.

At operation 106, the dipole layer is deposited on the high-κ dielectric layer. The dipole layer may be deposited on the high-κ dielectric layer at any suitable temperature and any suitable pressure. In some embodiments, at operation 106, the dipole layer is deposited on the high-κ dielectric layer at a temperature of less than or equal to 500° C. and at a pressure of less than or equal to 50 Torr. In some embodiments, the temperature is in a range of from 100° C. to 500° C., or in a range of from 150° C. to 450° C., in a range of from 200° C. to 400° C., or in a range of from 250° C. to 350° C. In some embodiments, the pressure is in a range of from 0 mTorr to 50 Torr, or in the range of from 100 m Torr to 50 Torr, or in the range of from 1 Torr to 40 Torr, in the range of from 10 Torr to about 35 Torr, or in the range of from 20 Torr to 30 Torr. Without intending to be bound by theory, it is believed that, when the dipole layer is deposited on the high-κ dielectric layer at a temperature of 450° C. or 500° C., for example, atoms from the dipole layer are driven into the high-κ dielectric layer.

In some embodiments, at operation 108, the capping layer is deposited on the dipole layer using a deposition technique, such as, but not limited to, ALD, CVD, PVD, MBE, MOCVD, spin-on, or other insulating layer deposition techniques known to the skilled artisan.

In some embodiments, at operation 110, the method 100 optionally includes annealing the semiconductor substrate at a temperature of less than or equal to 1100° C. to drive atoms from the dipole layer into the high-κ dielectric layer. In some embodiments, at operation 110, the method 100 comprises annealing the semiconductor substrate at a temperature of less than or equal to 1050° C. to drive atoms from the dipole layer into the high-κ dielectric layer. In some embodiments, the temperature is in a range of from 500° C. to 1100° C., including in a range of from 500° C. to 1050° C., including in a range of from 600° C. to 1025° C., in a range of from 700° C. to 1000° C., in a range of from 750° C. to 950° C., or in a range of from 800° C. to 900° C.

Without intending to be bound by theory, it is thought that annealing the semiconductor substrate according to operation 110 drives an increased number of atoms from the dipole layer into one or more of the interfacial layer or the high-κ dielectric layer, as compared to methods where annealing does not occur. In one or more embodiments, annealing the semiconductor substrate at operation 110 includes a rapid thermal process (RTP). The RTP may be any suitable process known to the skilled artisan. Without intending to be bound by theory, the RTP is believed to densify and improve the physical properties of the deposited dipole layer.

Without intending to be bound by theory, it is thought that a dipole region comprising a channel having n-type material or p-type material, and a dipole layer as described above, simplifies the existing integration flow, reducing the integration costs. Additionally, when atoms (such as metal atoms) from the dipole layer are embedded in the interfacial layer and/or the high-κ dielectric layer, the dipole region is formed and it is thought that oxidation can be reduced, which would potentially reduce the annealing temperature required.

In some embodiments, at operation 112, method 100 optionally includes performing an etching process to remove one or more of the capping layer or the dipole layer. The etching process can be any suitable etching process known to the skilled artisan. In some embodiments, the etching process comprises a wet etch process or a dry etch process. In some embodiments, the etching process comprises a wet etch process. In some embodiments, the wet etch process includes a pre-clean process. In some embodiments, the pre-clean process includes using one or more of ammonium hydroxide ($NH_4OH$) or water ($H_2O$). In some embodiments, the water ($H_2O$) is de-ionized water (DI). In some embodiments, the pre-clean process includes using a ratio of $DI:NH_4OH$ in a range of from 100:1 $DI:NH_4OH$ to 5:1 $DI:NH_4OH$.

Without intending to be bound by theory, when, at operation 110, the method 100 comprises annealing the semiconductor substrate at a temperature of less than or equal to 1050° C. to drive atoms from the dipole layer into the high-κ dielectric layer, the high-κ dielectric layer comprises properties of the dipole layer. Stated differently, after performing an etching process to remove the capping layer and/or the dipole layer at operation 112, the high-κ dielectric layer has dipole properties as a result of the annealing process at operation 110.

Embodiments of the disclosure advantageously provide deposition methods for tuning the amount of oxygen and/or nitrogen in the deposited dipole layer and the high-κ dielectric layer, which has dipole properties as a result of the annealing process at operation 110.

In one or more embodiments, the capping layer and the dipole layer are removed and a gate comprising one or more of a gate metal (not illustrated) or a gate contact (not illustrated) may optionally be formed or deposited on the exposed surface of the high-κ dielectric layer. In one or more embodiments, the gate metal may be any suitable material known to one of skill in the art. In one or more embodiments, the gate metal comprises one or more of nitrogen (N), copper (Cu), cobalt (Co), tungsten (W), titanium (Ti), tantalum (Ta), molybdenum (Mo), nickel (Ni), ruthenium (Ru), iridium (Ir), aluminum (Al), or platinum (Pt). In one or more specific embodiments, the gate metal comprises a metal selected from one or more of nitrogen (N), cobalt (Co), tungsten (W), titanium (Ti), molybdenum (Mo), nickel (Ni), ruthenium (Ru), iridium (Ir), aluminum (Al), or platinum (Pt). In other specific embodiments, the gate metal comprises a metal or a metal alloy selected from one or more of nitrogen (N), cobalt (Co), tungsten (W), titanium (Ti), molybdenum (Mo), ruthenium (Ru), hafnium (Hf), or zirconium (Zr). In embodiments where the gate metal is formed on the high-κ dielectric layer, the gate metal is deposited as a gate metal layer (not shown). The gate metal layer may be deposited using a deposition technique, such as, but not limited to, ALD, CVD, PVD, MBE, MOCVD, spin-on, or other insulating layer deposition techniques known to the skilled artisan. The gate metal layer may have any suitable thickness. In some embodiments, the gate metal layer has a thickness in a range of from 1 nm to 3 nm. In embodiments where the gate metal is formed on the high-κ dielectric layer, the gate metal layer has a capping layer thereon. The capping layer on the gate metal layer may have any suitable thickness. In some embodiments, the capping layer on the gate metal layer has a thickness in a range of from 0.5 nm to 2 nm, including in a range from 0.6 nm to 1.9 nm, in a range of from 0.7 nm to 1.8 nm, in a range of from 0.8 nm to 1.7 nm, in a range of from 0.9 nm to 1.6 nm, in a range of from 1 nm to 1.5 nm, in a range of from 1.1 nm to 1.4 nm, or in a range of from 1.2 nm to 1.3 nm.

In one or more embodiments, the gate contact may be any suitable material known to the skilled artisan. In one or more embodiments, the gate contact comprises an element or an alloy selected from one or more of nitrogen (N), copper (Cu), cobalt (Co), tungsten (W), titanium (Ti), molybdenum (Mo), nickel (Ni), ruthenium (Ru), iridium (Ir), tantalum (Ta), aluminum (Al), or platinum (Pt).

Figure 2:
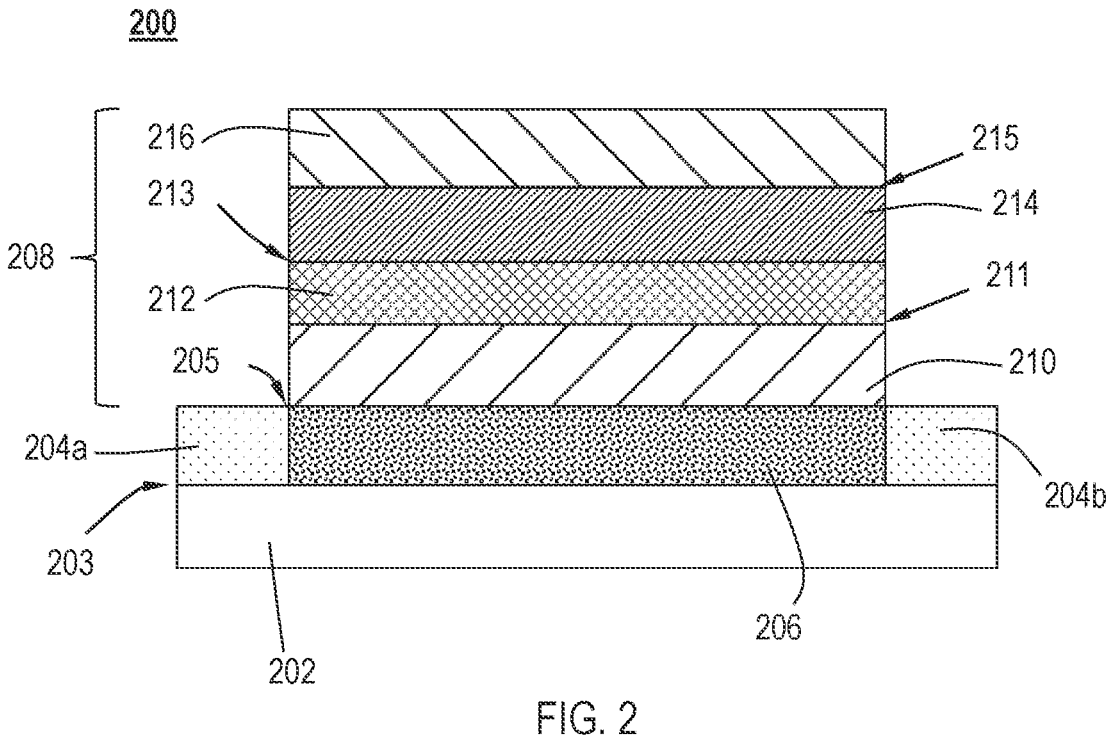
FIG. 2 illustrates a cross-sectional view of a semiconductor substrate according to one or more embodiments.
Figure 3A:
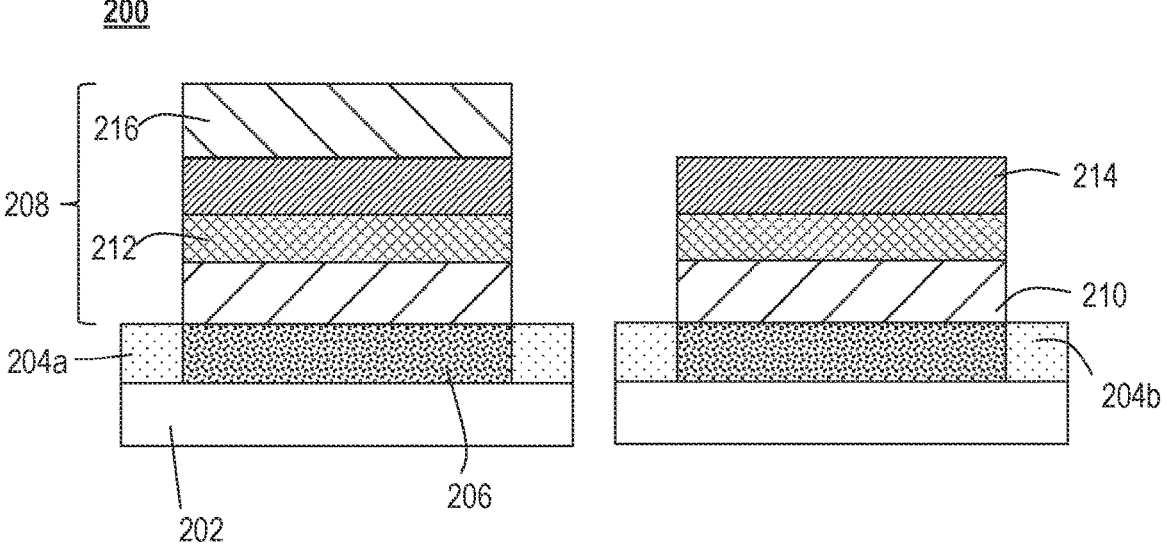
FIG. 3A illustrates a cross-sectional view of a semiconductor substrate according to one or more embodiments.
Figure 3B:
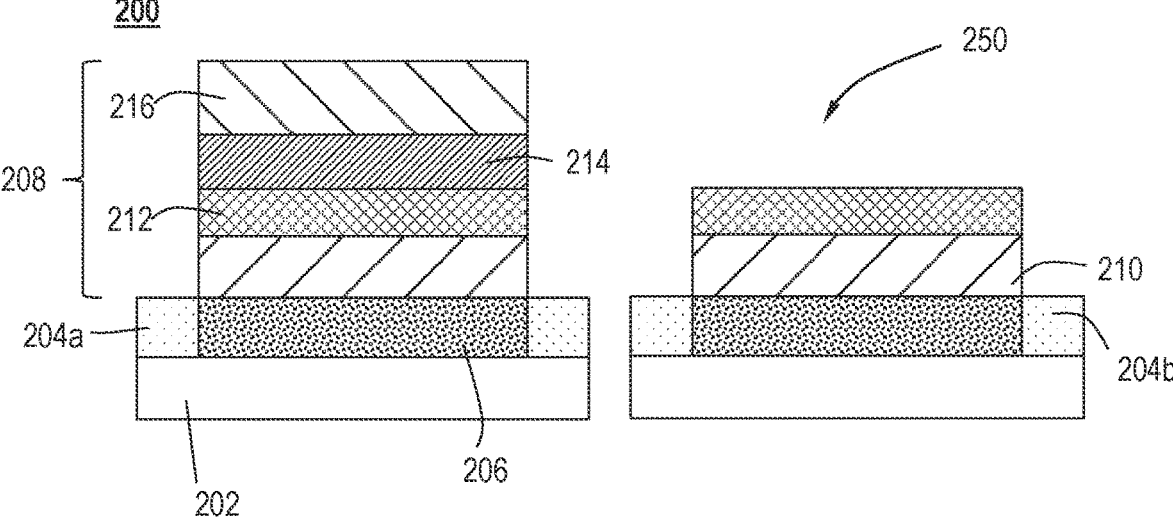
FIG. 3B illustrates a cross-sectional view of a semiconductor substrate according to one or more embodiments.

FIGS. 2, 3A, and 3B are cross-section views of an electronic device (e.g., a transistor) 200 according to one or more embodiments. The electronic devices 200 shown in FIGS. 2, 3A, and 3B may be manufactured by the method 100 illustrated in FIG. 1.

In one or more embodiments, the electronic device 200 comprises a semiconductor substrate 202 having a top surface 203. In one or more embodiments, the semiconductor substrate 202 can be any suitable substrate material. In one or more embodiments, the semiconductor substrate 202 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), copper indium gallium selenide (CIGS), other semiconductor materials, or any combination thereof. In one or more embodiments, the semiconductor substrate 202 comprises one or more of silicon (Si), germanium (Ge), gallium (Ga), arsenic (As), indium (In), phosphorus (P), copper (Cu), or selenium (Se). Although a few examples of materials from which the semiconductor substrate 202 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one or more embodiments, the semiconductor substrate 202 is a p-type or n-type substrate. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers.

In some embodiments, a source region 204a is on the top surface 203 of the semiconductor substrate 202. In one or more embodiments, the source region 204a has a source and a source contact (not illustrated). A drain region 204b is on the top surface 203 of the semiconductor substrate 202 opposite the source region 204a. In one or more embodiments, the drain region 204b has a drain and a drain contact (not illustrated).

In one or more embodiments, the source region 204a and/or the drain region 204b can be any suitable material known to the skilled artisan. In one or more embodiments, the source region 204a and/or the drain region 204b may have more than one layer. For example, the source region 204a and/or the drain region 204b may independently comprise three layers. In one or more embodiments, the source region 204a and the drain region 204b may independently comprise one or more of copper (Cu), cobalt (Co), tungsten (W), titanium (Ti), molybdenum (Mo), nickel (Ni), ruthenium (Ru), silver (Ag), gold (Au), iridium (Ir), platinum (Pt), phosphorus (P), germanium (Ge), silicon (Si), aluminum (Al), or zirconium (Zr). In some embodiments, the source region 204a and the drain region 204b may independently comprise a bottom layer of silicon with doped epi (e.g. SiGe, SiP, and the like), a second layer of silicide, which may contain nickel (Ni), titanium (Ti), aluminum (Al), and the like, and a third, or top, layer which may be a metal such as, but not limited to, cobalt, tungsten, ruthenium, and the like.

In some embodiments, the source region 204a and the drain region 204b may be raised source/drain regions formed by epitaxial growth. In one or more embodiments, the source contact and/or the drain contact may independently be selected from one or more of nitrogen (N), copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt). In one or more embodiments, formation of the source contact and/or the drain contact is conducted by any suitable process known to the skilled artisan, including, but not limited to ALD, CVD, PVD, MBE, MOCVD, spin-on, or other insulating layer deposition techniques known to the skilled artisan.

In one or more embodiments, a channel 206 is located between the source region 204a and the drain region 204b. In one or more embodiments, a dipole region 208 overlies the channel 206 and is in contact with one or more of the channel 206, the source region 204a, and the drain region 204b. In one or more embodiments, the dipole region 208 has a thickness in a range of from 2 nm to 6 nm, including in a range of from 2.5 nm to 5.5 nm, in a range of from 3 nm to 5 nm, or in a range of from 3.5 nm to 4.5 nm.

In one or more embodiments, the dipole region 208 comprises one or more of an interfacial layer 210, a high-κ dielectric layer 212, a dipole layer 214, and a capping layer 216. In some embodiments, the dipole region 208 comprises an interfacial layer 210, a high-κ dielectric layer 212, a dipole layer 214 and a capping layer 216. In some embodiments, the dipole region 208 comprises an interfacial layer 210, a high-κ dielectric layer 212, and a dipole layer 214.

In one or more embodiments, the interfacial layer 210 is deposited on a top surface 205 of a channel 206. In some embodiments, the interfacial layer 210 is deposited on the top surface 205 of the channel 206 according to operation 102 of method 100. In some embodiments, the interfacial layer 210 comprises a dielectric material selected from one or more of silicon (Si), silicon oxide (SiOx), doped silicon, doped silicon oxide, or spin-on dielectrics.

The interfacial layer 210 may have any suitable thickness. In some embodiments, the interfacial layer 210 has a thickness in a range of from 0.2 nm to 0.8 nm, including in a range of from 0.3 nm to 0.7 nm, or in a range of from 0.4 nm to 0.6 nm.

In one or more embodiments, a high-κ dielectric layer 212 is deposited on a top surface 211 of the interfacial layer 210. In some embodiments, the high-κ dielectric layer 212 is deposited on a top surface 211 of the interfacial layer 210 according to operation 104 of method 100. The high-κ dielectric layer 212 can be any suitable high-κ dielectric material known to the skilled artisan. In one or more embodiments, the high-κ dielectric layer 212 comprises one or more of hafnium oxide (HfOx), zirconium oxide (ZrOx), hafnium zirconium oxide (HfZrOx), or a spin-on dielectric.

The high-κ dielectric layer 212 may have any suitable thickness. In some embodiments, the high-κ dielectric layer 212 has a thickness in a range of from 1 nm to 2 nm, including in a range of from 1.1 nm to 1.9 nm, in a range of from 1.2 nm to 1.8 nm, in a range of 1.3 nm to 1.7 nm, or in a range of from 1.4 nm to 1.6 nm.

In one or more embodiments, a dipole layer 214 is deposited on a top surface 213 of the high-κ dielectric layer 212. In some embodiments, the dipole layer 214 is deposited on the top surface 213 of the high-κ dielectric layer 212 according to any of the processes described with respect to operation 106 of method 100. The dipole layer 214 may have any suitable thickness. In some embodiments, the dipole layer 214 has a thickness in a range of from 0.3 nm to 1.5 nm, including in a range of from 0.4 nm to 1.4 nm, in a range of from 0.5 nm to 1.3 nm, in a range of form 0.6 nm to 1.2 nm, in a range of from 0.7 nm to 1.1 nm, or in a range of from 0.8 nm to 1.0 nm.

In some embodiments, the dipole layer 214 comprises one or more of titanium oxynitride (TiON), tantalum oxynitride (TaON), aluminum oxynitride (AlON), niobium oxynitride (NbON), antimony oxynitride (SbON), tellurium oxynitride (TeON), lanthanum oxynitride (LaON), yttrium oxynitride (YON), strontium oxynitride (SrON), scandium oxynitride (ScON). In some embodiments, the dipole layer 214 comprises aluminum oxynitride (AlON). In some embodiments, the deposited dipole layer 214 advantageously has a nitrogen content of less than or equal to 5%, less than or equal to 2%, or less than or equal to 1% on an atomic basis.

In one or more embodiments, a capping layer 216 is deposited to control film oxidation after deposition of the dipole layer 214. In one or more embodiments, the capping layer 216 is deposited on a top surface 215 of the dipole layer 214 according to operation 108 of method 100. In one or more embodiments, the electronic device 200 does not include the capping layer 216.

In one or more embodiments where the electronic device 200 includes the capping layer 216, the capping layer 216 is an in situ capping layer. In some embodiments, the capping layer 216 comprises one or more of amorphous silicon, a metal, a metal carbide, a metal nitride, or a metal oxide. In some embodiments, the capping layer 216 comprises aluminum oxide (AlOx). The capping layer 216 may have any suitable thickness. In some embodiments, the capping layer has a thickness in a range of from 0.5 nm to 2 nm, including in a range from 0.6 nm to 1.9 nm, in a range of from 0.7 nm to 1.8 nm, in a range of from 0.8 nm to 1.7 nm, in a range of from 0.9 nm to 1.6 nm, in a range of from 1 nm to 1.5 nm, in a range of from 1.1 nm to 1.4 nm, or in a range of from 1.2 nm to 1.3 nm.

In one or more embodiments, the electronic device 200 includes hafnium oxide (HfOx) as the high-κ dielectric layer 212, aluminum oxynitride (AlON) as the dipole layer 214, and aluminum oxide (AlOx) as the capping layer 216.

Referring to FIG. 3A, in one or more embodiments, the capping layer 216 on the PFET side 250 is removed by patterning (optional operation 112). Referring to FIG. 3B, in one or more embodiments, the dipole layer 214 and the capping layer 216 on the PFET side 250 are removed by patterning (optional operation 112).

In one or more embodiments, a gate comprising one or more of a gate metal (not illustrated) or a gate contact (not illustrated) may optionally be formed or deposited on the exposed surface of the high-κ dielectric layer after removing the capping layer and the dipole layer. The gate metal may be any material known to one of skill in the art. In one or more embodiments, the gate metal comprises one or more of nitrogen (N), copper (Cu), cobalt (Co), tungsten (W), titanium (Ti), tantalum (Ta), molybdenum (Mo), nickel (Ni), ruthenium (Ru), iridium (Ir), aluminum (Al), or platinum (Pt). In one or more specific embodiments, the gate metal comprises a metal selected from one or more of nitrogen (N), cobalt (Co), tungsten (W), titanium (Ti), molybdenum (Mo), nickel (Ni), ruthenium (Ru), iridium (Ir), aluminum (Al), or platinum (Pt). In other specific embodiments, the gate metal 226 comprises a metal or a metal alloy selected from one or more of nitrogen (N), cobalt (Co), tungsten (W), titanium (Ti), molybdenum (Mo), ruthenium (Ru), hafnium (Hf), or zirconium (Zr).

In embodiments where the gate metal is formed on the high-κ dielectric layer 212, the gate metal is deposited as a gate metal layer (not shown). The gate metal layer may be deposited using a deposition technique, such as, but not limited to, ALD, CVD, PVD, MBE, MOCVD, spin-on, or other insulating layer deposition techniques known to the skilled artisan. The gate metal layer may have any suitable thickness. In some embodiments, the gate metal layer has a thickness in a range of from 1 nm to 3 nm. In embodiments where the gate metal is formed on the high-κ dielectric layer 212, the gate metal layer has a capping layer thereon. The capping layer formed on the gate metal layer may have the same or similar properties as the capping layer 216 illustrated in the Figures. The capping layer (e.g., capping layer 216) on the gate metal layer may have any suitable thickness. In some embodiments, the capping layer (e.g., capping layer 216) on the gate metal layer has a thickness in a range of from 0.5 nm to 2 nm, including in a range from 0.6 nm to 1.9 nm, in a range of from 0.7 nm to 1.8 nm, in a range of from 0.8 nm to 1.7 nm, in a range of from 0.9 nm to 1.6 nm, in a range of from 1 nm to 1.5 nm, in a range of from 1.1 nm to 1.4 nm, or in a range of from 1.2 nm to 1.3 nm.

In one or more embodiments, the gate contact may be any suitable material known to the skilled artisan. In one or more embodiments, the gate contact comprises an element or an alloy selected from one or more of nitrogen (N), copper (Cu), cobalt (Co), tungsten (W), titanium (Ti), molybdenum (Mo), nickel (Ni), ruthenium (Ru), iridium (Ir), tantalum (Ta), aluminum (Al), or platinum (Pt).

Figure 4:
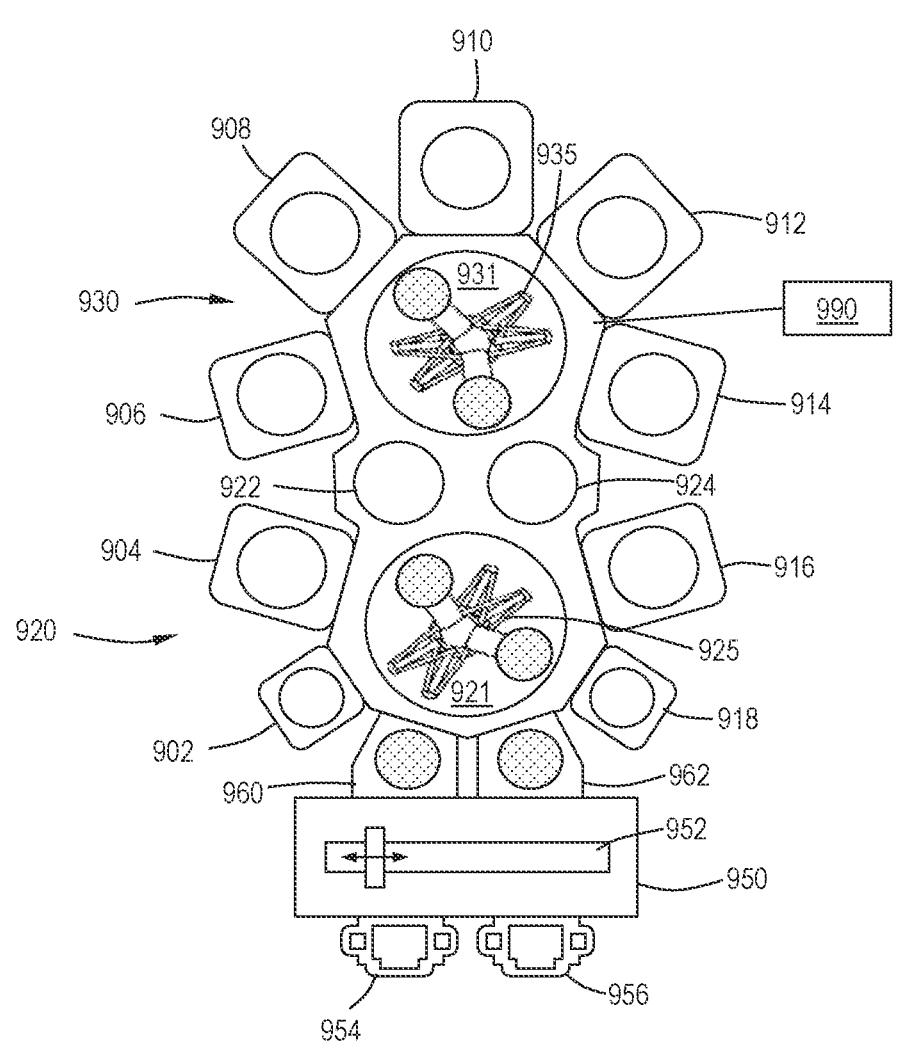
FIG. 4 illustrates a cluster tool according to one or more embodiments of the disclosure.

Additional embodiments of the disclosure are directed to cluster tools 900 for the formation of the electronic devices and methods described, as shown in FIG. 4.

The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber, a thermal processing (RTP) chamber, a plasma oxidation chamber, a plasma nitridation chamber, and an atomic layer deposition (ALD) chamber. The particular arrangement of process chambers and components can be varied depending on the cluster tool and should not be taken as limiting the scope of the disclosure.

In the embodiment shown in FIG. 4, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock chamber 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In one or more embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In one or more embodiments, the cluster tool 900 comprises a central transfer station 921, 931 comprising at least one robot 925, 935 configured to deposit an interfacial layer on a top surface of a channel located between a source and a drain on a semiconductor substrate; deposit a high-κ dielectric layer on the interfacial layer; deposit a dipole layer on the high-κ dielectric layer; deposit a capping layer on the dipole layer; optionally, anneal the semiconductor substrate; or, optionally, perform an etching process to remove one or more of the capping layer or the dipole layer. In embodiments where the capping layer is not present, the at least one robot 925, 935 is configured to perform an etching process to remove the dipole layer. In one or more embodiments, the at least one robot 925, 935 is configured to form or deposit a gate comprising one or more of a gate metal (not illustrated) or a gate contact (not illustrated) on the exposed surface of the high-κ dielectric layer after removing one or more of the capping layer or the dipole layer.

One or more embodiments of the disclosure are directed to a non-transitory computer readable medium including instructions, that, when executed by a controller of a processing chamber, cause the processing chamber to perform the operations of method 100. In some embodiments, the non-transitory computer readable medium includes instructions, that, when executed by a controller of a processing chamber, cause the processing chamber to perform the operations of: deposit an interfacial layer on a top surface of a channel located between a source and a drain on a semiconductor substrate (operation 102); deposit a high-κ dielectric layer on the interfacial layer (operation 104); deposit a dipole layer on the high-κ dielectric layer (operation 106); deposit a capping layer on the dipole layer (operation 108); optionally, anneal the semiconductor substrate (operation 110); or, optionally, perform an etch process to remove one or more of the capping layer or the dipole layer (operation 112).

In embodiments where the capping layer is not present, the non-transitory computer readable medium includes instructions, that, when executed by a controller of a processing chamber, cause the processing chamber to perform the operations of: perform an etching process to remove the dipole layer (operation 112).

In further embodiments, the non-transitory computer readable medium includes instructions, that, when executed by a controller of a processing chamber, cause the processing chamber to perform the operations of: form or deposit a gate comprising one or more of a gate metal (not illustrated) or a gate contact (not illustrated) on the exposed surface of the high-κ dielectric layer after removing one or more of the capping layer or the dipole layer.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of manufacturing an electronic device, the method comprising:

depositing an interfacial layer on a top surface of a channel located between a source and a drain on a semiconductor substrate;

depositing a high-κ dielectric layer on the interfacial layer;

exposing the semiconductor substrate to a co-flow of a metal-containing precursor and a nitrogen-containing reactant, a pulse of the metal-containing precursor, and a pulse an oxygen-containing reactant to deposit a dipole layer on the high-κ dielectric layer, the dipole layer comprising a metal oxynitride (MON); and depositing a capping layer on the dipole layer.

2. The method of claim 1, wherein the interfacial layer comprises a dielectric material selected from one or more of silicon (Si), silicon oxide (SiOx), doped silicon, doped silicon oxide, or spin-on dielectrics.

3. The method of claim 1, wherein the high-κ dielectric layer comprises one or more of hafnium oxide (HfOx), zirconium oxide (ZrOx), or hafnium zirconium oxide (HfZrOx).

4. The method of claim 1, wherein the dipole layer has a nitrogen content of less than or equal to 1%, on an atomic basis.

5. The method of claim 1, wherein the metal-containing precursor comprises one or more of titanium (Ti), tantalum (Ta), aluminum (Al), niobium (Nb), antimony (Sb), tellurium (Te), lanthanum (La), yttrium (Y), strontium (Sr), or scandium (Sc).

6. The method of claim 5, wherein the metal-containing precursor comprises trimethylaluminum (TMA) or aluminum chloride ($AlCl_3$).

7. The method of claim 1, wherein the nitrogen-containing reactant comprises ammonia ($NH_3$).

8. The method of claim 1, wherein the oxygen-containing reactant comprises water ($H_2O$).

9. The method of claim 1, wherein the capping layer comprises one or more of amorphous silicon, a metal, a metal carbide, a metal nitride, or a metal oxide.

10. The method of claim 1, further comprising annealing the semiconductor substrate at a temperature of less than or equal to 1100° C. to drive atoms from the dipole layer into the high-κ dielectric layer.

11. The method of claim 1, further comprising performing an etching process to remove one or more of the capping layer or the dipole layer after annealing the semiconductor substrate.

12. A method of manufacturing an electronic device, the method comprising:

depositing an interfacial layer on a top surface of a channel located between a source and a drain on a semiconductor substrate, the interfacial layer comprising a dielectric material selected from one or more of silicon (Si), silicon oxide (SiOx), doped silicon, doped silicon oxide, or spin-on dielectrics;

depositing a high-κ dielectric layer on the interfacial layer, the high-κ dielectric layer comprising one or more of hafnium oxide (HfOx), zirconium oxide (ZrOx), or hafnium zirconium oxide (HfZrOx);

exposing the semiconductor substrate to a co-flow of an aluminum-containing precursor and a nitrogen-containing reactant, a pulse of the aluminum-containing precursor, and a pulse of an oxygen-containing reactant to deposit a dipole layer on the high-κ dielectric layer, the dipole layer comprising aluminum oxynitride (AlON); and depositing a capping layer on the dipole layer, the capping layer comprising one or more of amorphous silicon, a metal, a metal carbide, a metal nitride, or a metal oxide.

13. The method of claim 12, wherein the aluminum-containing precursor comprises trimethylaluminum (TMA) or aluminum chloride (AlCl₃).

14. The method of claim 12, wherein the dipole layer has a nitrogen content of less than or equal to 1%, on an atomic basis.

\* \* \* \* \*